US009658523B2

(12) United States Patent
Zhang et al.

(10) Patent No.: US 9,658,523 B2
(45) Date of Patent: *May 23, 2017

(54) INTERCONNECT STRUCTURE HAVING LARGE SELF-ALIGNED VIAS

(71) Applicants: STMicroelectronics, Inc., Coppell, TX (US); International Business Machines Corporation, Armonk, NY (US)

(72) Inventors: John H. Zhang, Altamont, NY (US); Lawrence A. Clevenger, LaGrangeville, NY (US); Carl Radens, LaGrangeville, NY (US); Yiheng Xu, Hopewell Junction, NY (US); Richard Stephen Wise, Ridgefield, CT (US); Terry Spooner, Clifton Park, NY (US); Nicole A. Saulnier, Albany, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 301 days.

This patent is subject to a terminal disclaimer.

(21) Appl. No.: 14/231,448

(22) Filed: Mar. 31, 2014

(65) Prior Publication Data
US 2015/0279784 A1 Oct. 1, 2015

(51) Int. Cl.
*G03F 1/36* (2012.01)
*H01L 21/768* (2006.01)
(Continued)

(52) U.S. Cl.
CPC ............ *G03F 1/36* (2013.01); *H01L 21/0274* (2013.01); *H01L 21/31144* (2013.01);
(Continued)

(58) Field of Classification Search
CPC .......................... H01L 23/5385; H01L 23/538
See application file for complete search history.

(56) References Cited

U.S. PATENT DOCUMENTS 6,156,640 A * 12/2000 Tsai .................... H01L 21/0276
257/E21.029
2015/0279780 A1* 10/2015 Zhang ................ H01L 23/5226
257/774

OTHER PUBLICATIONS

Fukasawa et al., "BEOL Process Integration with Cu/SiCOH (k=2.8) Low-k Interconnects at 65 nm Groundrules," IEEE, pp. 9-11, 2005.
(Continued)

*Primary Examiner* — Mohammad Choudhry
(74) *Attorney, Agent, or Firm* — Seed IP Law Group LLP

(57) ABSTRACT

A wavy line interconnect structure that accommodates small metal lines and large vias is disclosed. A lithography mask design used to pattern metal line trenches uses optical proximity correction (OPC) techniques to approximate wavy lines using rectangular opaque features. The large vias can be formed using a self-aligned dual damascene process without the need for a separate via lithography mask. Instead, a sacrificial layer allows etching of an underlying thick dielectric block, while protecting narrow features of the trenches that correspond to the metal line interconnects. The resulting vias have an aspect ratio that is relatively easy to fill, while the larger via footprint provides low via resistance. By lifting the shrink constraint for vias, thereby allowing the via footprint to exceed the minimum size of the metal line width, a path is cleared for further process generations to continue shrinking metal lines to dimensions below 10 nm.

14 Claims, 7 Drawing Sheets

(51) Int. Cl.
    *H01L 23/522*     (2006.01)
    *H01L 23/528*     (2006.01)
    *H01L 21/027*     (2006.01)
    *H01L 21/311*     (2006.01)

(52) U.S. Cl.
    CPC .. *H01L 21/76808* (2013.01); *H01L 21/76816* (2013.01); *H01L 23/528* (2013.01); *H01L 23/5226* (2013.01); *H01L 2924/0002* (2013.01)

(56) References Cited

OTHER PUBLICATIONS

Ida et al., "PECVD Low-k (~2.7) Dielectric SiCOH Film Development and Integration for 65 nm CMOS Devices," Conference Proceedings AMC XXI, pp. 89-95, 2006.
Wolf, "Silicon Processing for the VLSI Era" vol. 4, pp. 674-679, 2002 (6 pages).
Zhang et al., "Advanced Interconnect With Air Gap," U.S. Appl. No. 14/098,286, filed Dec. 5, 2013, 37 pages.
Zhang et al., "Trench Interconnect Having Reduced Fringe Capacitance," U.S. Appl. No. 14/098,346, filed Dec. 5, 2013, 33 pages.

* cited by examiner

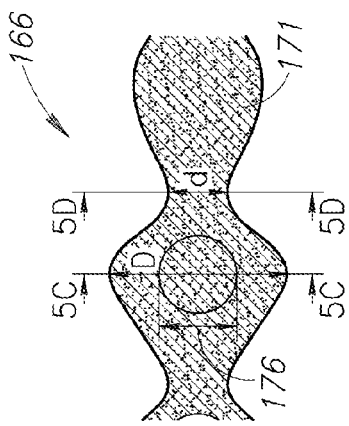
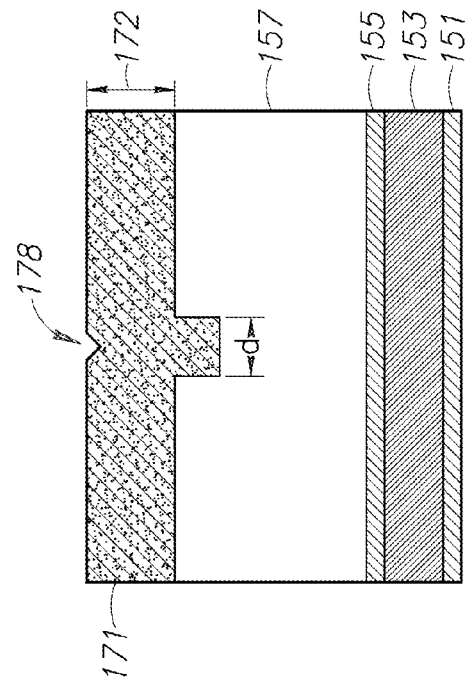
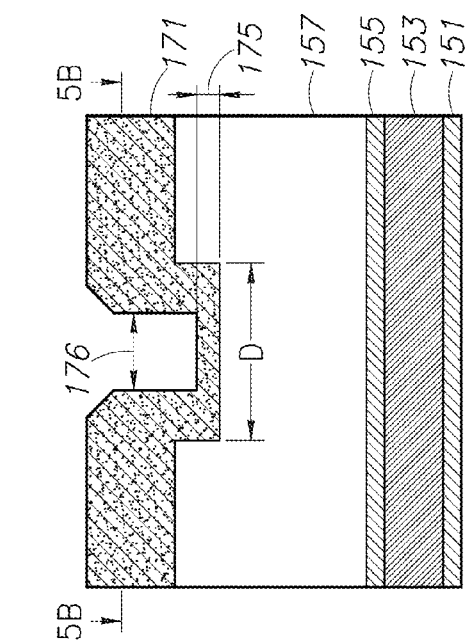

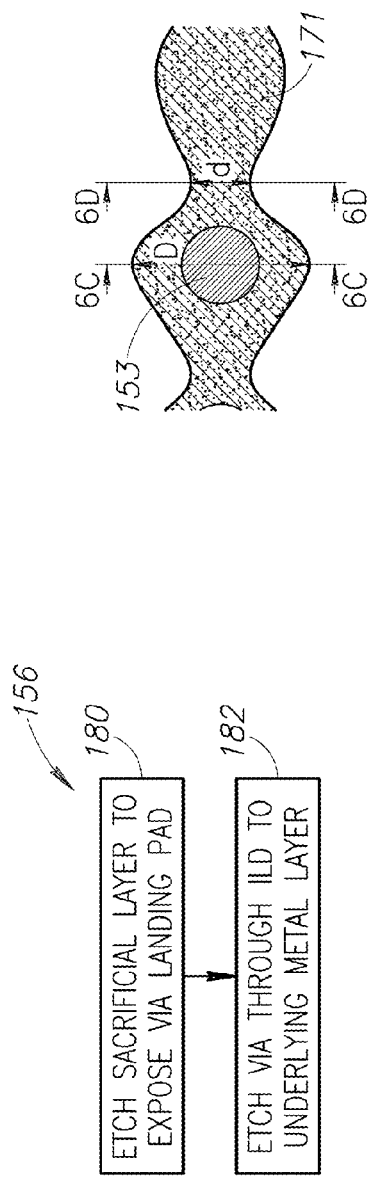
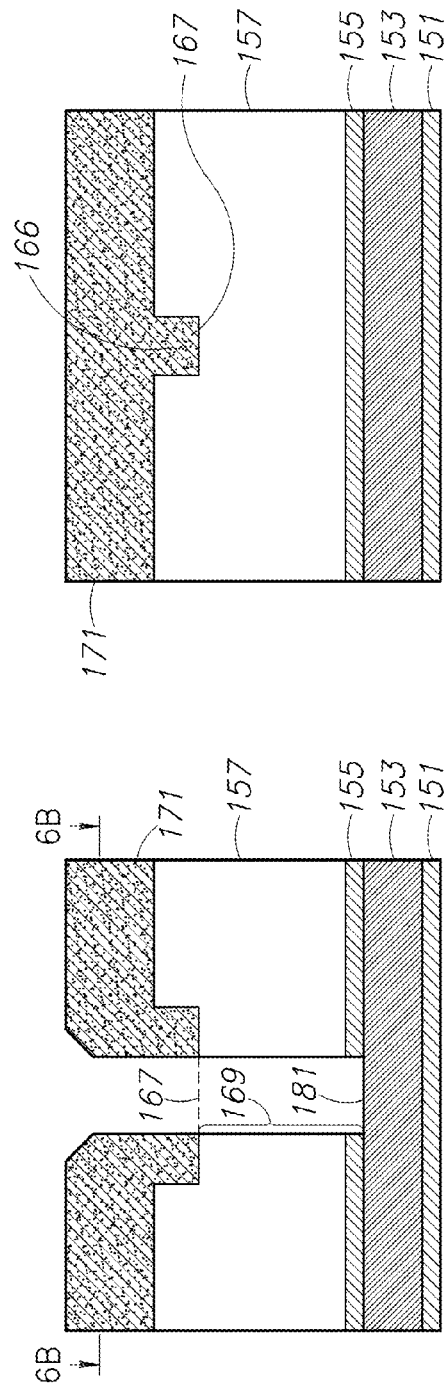
FIG.6A
FIG.6B
FIG.6C
FIG.6D

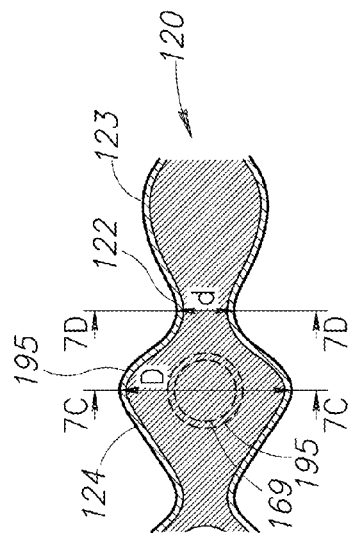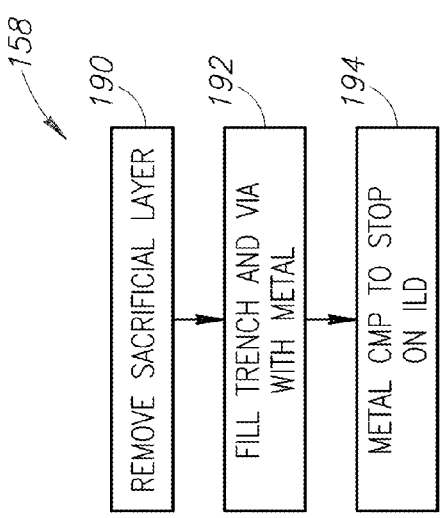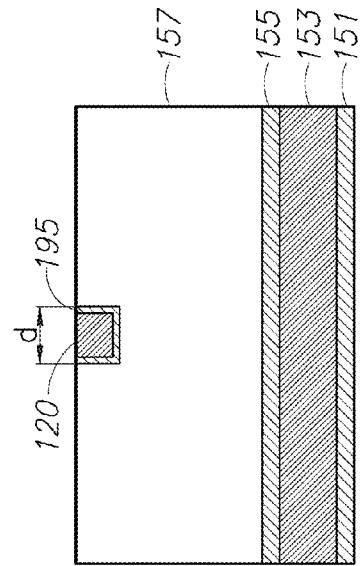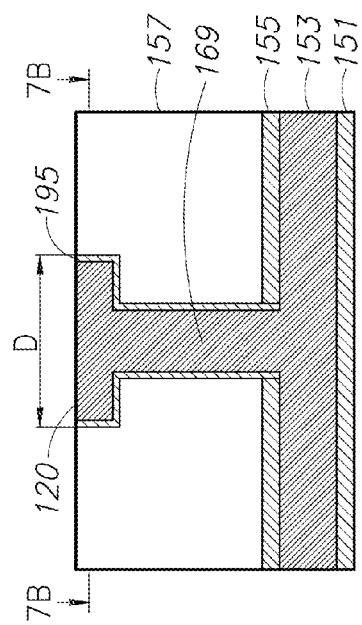
FIG.7A
FIG.7B
FIG.7C
FIG.7D

INTERCONNECT STRUCTURE HAVING LARGE SELF-ALIGNED VIAS

BACKGROUND

Technical Field

The present disclosure generally relates to high speed integrated circuits, and in particular, to the fabrication of interconnect structures using a self-aligned dual damascene process.

Description of the Related Art

As integrated circuit technology advances, building metal interconnect structures that are used to wire transistors together becomes more and more challenging. Metal lines can assume a variety of different shapes, from straight wires to cells made up of intertwined C-shapes. Regardless of their shapes, design rules for metal lines are typically based on scaling a pitch dimension that assumes a regular pattern of equal line widths and spacings between the metal lines at each metal layer. Metal line widths are generally expected to shrink with every new process generation to further improve integrated circuit performance.

Depending on the type of process integration scheme used, vias connecting stacked metal lines vertically to one another are constrained to be smaller than the metal lines in order for the via footprint to be surrounded by metal. Such a constraint exists, for example, when forming vias according to a self-aligned dual damascene process that avoids a separate via lithography step. Thus, as the metal line design widths shrink with each process generation, the self-aligned vias shrink as well. However, smaller vias incur higher via resistance, causing RC delays to worsen. In addition, smaller via footprints cause the via aspect ratio, i.e., the ratio of height to width, to increase, making the vias taller and narrower, and therefore more difficult to fill with metal. Incomplete via fill in turn degrades reliability by causing open circuit failures, for example. Thus, for multiple reasons, it is advantageous for via footprints to remain large, while metal lines continue to shrink with each technology generation.

BRIEF SUMMARY

An interconnect structure having wavy metal lines allows via footprints to exceed the nominal width of metal line portions connecting them. In one embodiment, the resulting metal line profile shape resembles a bicycle chain. In another embodiment, the metal line resembles a linear series of T-shaped unit cells, in which the width of the metal line alternates between a narrow value, an intermediate value, and a wide value. The wide value corresponds to a large via landing pad for vias forming an electrical connection to the next highest metal layer. To achieve greater lateral packing density, adjacent wavy metal lines can be staggered so that the via landing pads on one metal line are next to the narrow metal connecting portions of neighboring metal lines. By lifting the shrink constraint for vias, thereby allowing the via footprint to exceed the minimum size of the metal line width, a path is cleared for further process generations to continue shrinking metal lines to dimensions below 10 nm.

A wavy line interconnect structure can be formed using a dual damascene process in which vias are self-aligned without the need for a dedicated lithography mask. Instead, metal line trenches are lined with a sacrificial layer that completely fills the narrow spaces while under-filling the wide spaces that correspond to via locations. The sacrificial layer thus acts as a via hard mask, allowing etching of the underlying thick dielectric block, while protecting narrow features of the trenches that correspond to the metal line interconnects. The resulting vias have an aspect ratio that is relatively easy to fill, while the larger footprint provides low via resistance.

One way to pattern wavy metal lines using conventional optical lithography uses a mask cell design that includes a series of rectangular opaque features diagonally offset from one another along an axis. Via landing pads are then added at one end of the mask cell by placing two rectangular features adjacent to one another. The method disclosed takes advantage of the shortcomings of optical lithography to achieve the desired wavy line pattern by anticipating diffraction errors that will occur during exposure of the rectangular features. Such a technique is generally known in the art as optical proximity correction (OPC). Typically, OPC is used to produce square corners where the standard lithography tends to round off the corners of a circuit pattern. In this case, however, the rounding effect is intentional. During the patterning process, corners of the rectangular features will transfer to the photoresist and the metal trench as rounded features. Meanwhile, the offset rectangular features, instead of remaining distinct, will join together to approximate the desired undulating wavy line shape. In similar fashion, each rectangle pair will transfer to the metal trench layer as a combined shape, forming a single large landing pad to accommodate the vias.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 5A is a process flow diagram showing a detailed sequence of processing steps that can be used to form a sacrificial layer for use as a hard mask, according to one embodiment.

FIG. 5B is a top plan view of wavy trenches after carrying out processing steps shown in FIG. 5A.

FIGS. 5C and 5D are cross-sectional views, along the cut lines shown, of the hard mask after carrying out processing steps shown in FIG. 5A.

FIG. 6A is a process flow diagram showing a detailed sequence of processing steps that can be used to form large self-aligned vias, according to one embodiment.

FIG. 6B is a top plan view of wavy trenches after carrying out processing steps shown in FIG. 6A.

FIGS. 6C and 6D are cross-sectional views, along the cut lines shown, of the large self-aligned vias after carrying out processing steps shown in FIG. 6A.

FIG. 7A is a process flow diagram showing a detailed sequence of processing steps that can be used to fill the wavy line trenches and the large vias with metal, according to one embodiment.

FIG. 7B is a top plan view of wavy trenches after carrying out processing steps shown in FIG. 7A.

FIGS. 7C and 7D are cross-sectional views, along the cut lines shown, of wavy metal lines and filled vias after carrying out processing steps shown in FIG. 7A.

DETAILED DESCRIPTION

Figure 1A:
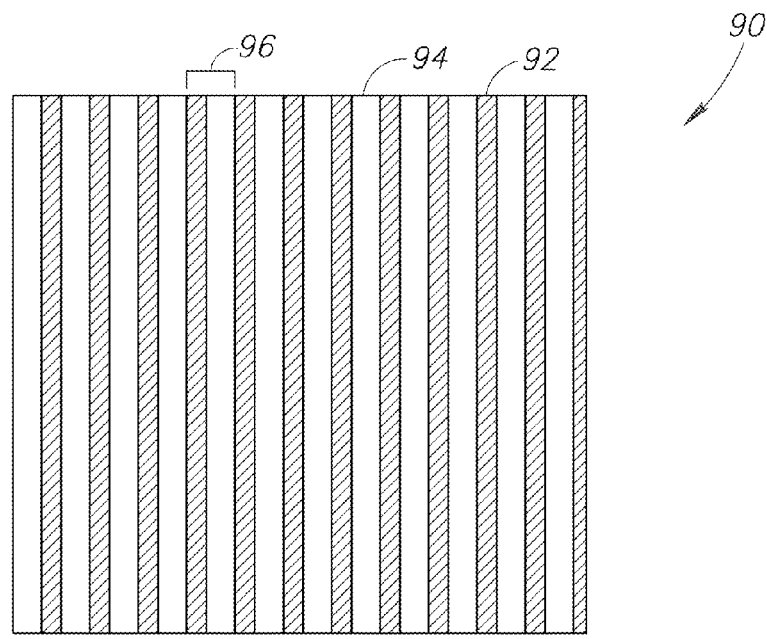
FIG. 1A is derived from a top-down scanning electron micrograph of a conventional array of metal lines, according to the prior art.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to interconnect structures that have been produced; however, the present disclosure and the reference to certain materials, dimensions, and the details and ordering of processing steps are exemplary and should not be limited to those shown.

Turning now to the Figures, FIG. 1A shows a top plan view of a conventional array 90 of metal lines 92 inlaid in a dielectric block 94. Such an array characterized by a pitch 96 of 40 nm or less typically is fabricated of copper or a copper alloy using a dual damascene process, as is well known in the art [see, for example, "Silicon Processing for the VLSI Era," Vol. 4, p. 674-679, by Stanley Wolf]. In short, a dual damascene process entails first forming a trench in the dielectric block 94, and then forming a via that extends from the bottom of the trench to an underlying metal layer. The trench and the via are then filled with metal together in one step. Thus, each interconnect layer entails performing two lithography steps and one metal deposition step. One of the two lithography steps can be eliminated by employing a self-aligned via process in which a sacrificial layer is used as a hard mask. Self-aligned dual damascene vias are also well known in the art and can be understood by referencing the Wolf article cited above. Vias underlying the metal lines 92 are not shown in FIG. 1A because they have equal or smaller widths than the metal lines and they are therefore obscured by the metal lines.

Figure 1B:
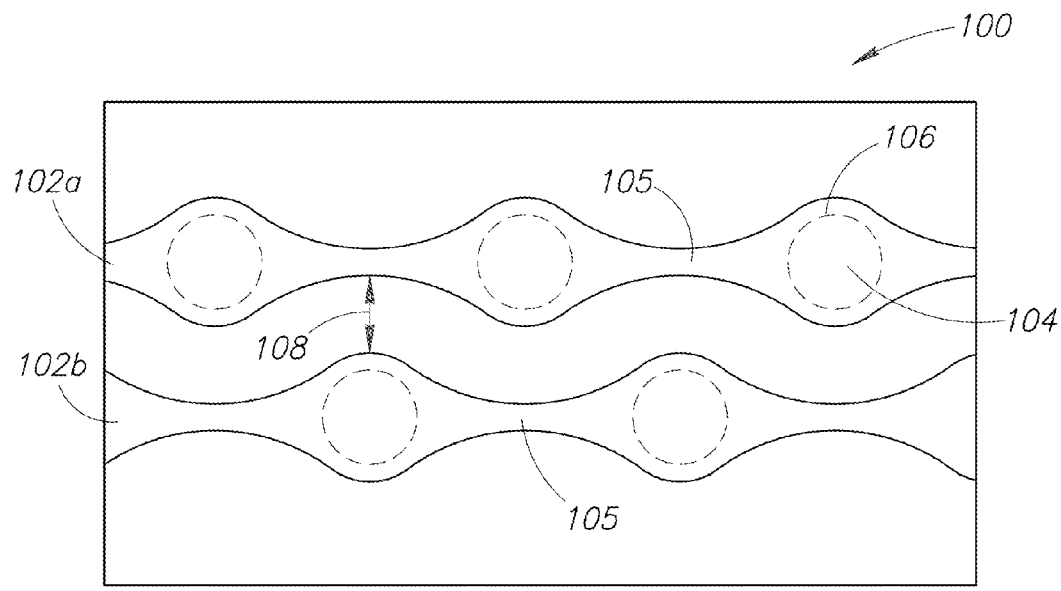
FIG. 1B is a layout diagram of adjacent narrow metal lines encompassing large vias according to a first embodiment in which the metal lines resemble a bicycle chain.

With reference to FIG. 1B, for the reasons explained above, it is desirable to form wavy metal lines 102 shaped like bicycle chain structures 100 in which wide portions 104 accommodate via landing pads 106 spaced periodically between narrow portions 105. Such a configuration allows the via landing pads 106 to exceed the width of the narrow portions 105. Adjacent metal lines 102a and 102b can be staggered relative to one another so that the via landing pads located at the wide portions 104 along 102a are aligned with the narrow portions 105 of neighboring wavy metal line 102b. Thus, the wavy metal lines can maintain a constant spacing 108. The bicycle chain structures 100 are thus one exemplary embodiment of a wavy metal line design that accommodates large vias.

Figure 2A:
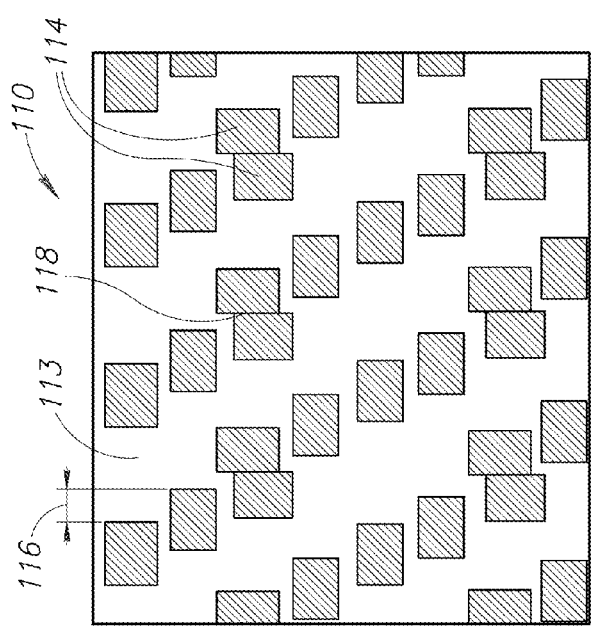
FIG. 2A is a layout diagram of an optical lithography mask design showing regions of chrome on a glass mask plate that can be used to form wavy metal lines according to a second embodiment.
Figure 2B:
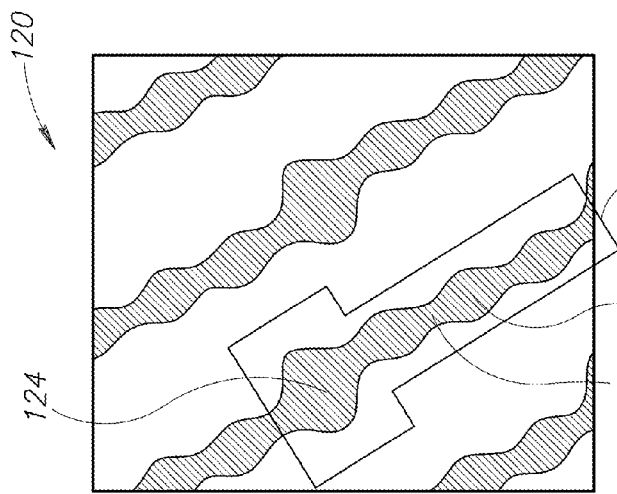
FIG. 2B is derived from a top-down scanning electron micrograph of the structure as made when the mask has an array of rectangular-shaped vias that create wavy metal lines having narrow, intermediate, and wide regions, the wide regions accommodating large vias.
Figure 2C:
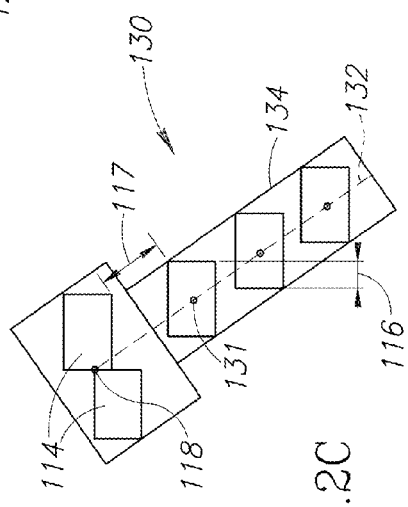
FIG. 2C is a schematic of a template corresponding to the unit cell that describing the via shape arrangement shown in FIG. 2B.

A second exemplary embodiment of such a wavy metal line design is shown in FIGS. 2A, 2B, and 2C. FIG. 2A shows an optical lithography wavy line mask design 110 that results in an array of wavy metal lines structures 120 shown in FIG. 2B. The wavy metal line structures 120 include a plurality of narrow portions 122, intermediate width portions 123, and wide portions 124, along each wavy metal line. In one embodiment, the narrow portions 122 are in the range of about 5-30 nm wide, with a nominal pitch of 48 nm. Dimensions of the wide portions 124 are within the range of about 10-40 nm. Wavy metal lines having about three or more narrow portions 122 for every wide portion 124 maintain an average line width that is slightly larger than the width of the narrow portion 122. Again, adjacent metal lines can be staggered so the wide portions 124 of one line are placed next to the intermediate or narrow portions 123, 122 of neighboring lines.

The wavy metal line structures 120 are achieved by approximating the portions of varying widths using rectangular mask features in the wavy line mask design 110. For example, the wavy line mask design 110 can be implemented by forming rectangular opaque features 112 and 114 made of chrome on a glass plate 113. When the mask is exposed to light in an optical lithography stepper or scanner, the light is blocked by the rectangular opaque features 112 and 114. However, diffraction effects cause the pattern of rectangles to become blurred at the target surface, thereby producing the wavy-line patterns shown in FIG. 2B.

The optical lithography mask design 110 (FIG. 2A) can be thought of as an optical lithography mask cell 130 (FIG. 2C) replicated throughout a region of a larger optical lithography mask that may include many different mask designs. The optical lithography mask cell 130, shown in FIG. 2C, is then a fundamental building block of the mask design 110 shown in FIG. 2A. The optical lithography mask cell 130 shows more clearly the relative orientations of the rectangular opaque features 112 and 114. The rectangular opaque features 112 are isolated rectangles, offset from one another by a first offset distance 116. Pairs of rectangular opaque features 114 touch one another at least at a contact point 118, and the pairs are then offset from the rectangular opaque features 112 by a second offset distance 117. Furthermore, the contact point 118 and center points 131 of the rectangular opaque features 112 are aligned along an axis 132. When a template 134 of the mask cell 130 is overlaid onto the wavy metal line structures 120, the various elements of the metal line can more clearly be associated with corresponding mask features that define them. It is noted that the via landing pads that correspond to the wide portions 124 are formed by the pairs of rectangular opaque features 114, while the narrow portions 122 of the metal lines correspond to locations where adjacent rectangular features blur together.

Intentional manipulation of mask features to compensate for shortcomings in lithographic capability is well known in the art of photolithography as Optical Proximity Correction (OPC). OPC is often used to pattern square corners that would otherwise become rounded by diffraction effects. In the present case, however, the rounded features forming the wavy metal line structures 120 are intentionally created by leveraging distortion that occurs in the lithography process, as opposed to correcting for the distortion. While it is true that conventional metal lines are not all as uniform and straight as those shown in FIG. 1A, the resulting wavy metal line structures 120 are unique compared with known existing metal line shapes as shown in documentation describing SRAM cells associated with various microprocessor chips, e.g., those of Texas Instruments OMAP™, TMX320x, D6298x, and the like.

Figure 3:
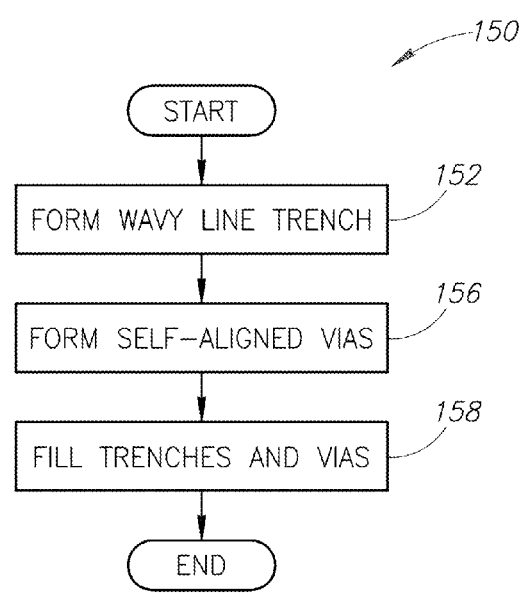
FIG. 3 is a high-level flow diagram of a method of fabricating large self-aligned vias in a dual damascene interconnect process, according to one embodiment.

FIG. 3 shows general steps in a method 150 of fabricating wavy metal lines having large vias. The method 150 is one embodiment of a self-aligned dual damascene process for fabricating an interconnect structure, i.e., a network of wavy metal lines and large vias, that provides electrical connections for transistors within integrated circuits. Metal lines within the interconnect structure have the wavy line pattern of the wavy metal line structures 120 shown in FIG. 2B.

At 152, wavy trenches are formed in a dielectric block.

At 156, self-aligned vias are formed in the dielectric block, extending away from the wavy trenches.

At 158, the wavy trenches and the vias are filled with metal in the same process step.

FIGS. 4A-7D show and describe in further detail steps in the method 150. In each set of Figures A-D, A is a detailed flow diagram; B is a top plan view showing at least a wide portion 104 and a narrow portion 105 of a wavy metal line 102 after performing the steps shown in A; C is a cross-sectional schematic view through the wide portion 104 that accommodates a via; and D is a cross-sectional view through the narrow portion 105. In accordance with convention, arrows on each cut line represent the direction of an observer's eye looking at the corresponding cut plane.

FIGS. 4A-4D show and describe patterning the wavy line trenches in a dielectric block, at step 152, according to one embodiment. Formation of the wavy line trenches is the only process step in the method 150 that entails use of photolithography. The trench formation begins with a dielectric block 104 that has been deposited onto an underlying metal layer, e.g., metal 1. The dielectric block 157 is made of silicon dioxide or an ultra-low-k (ULK) dielectric material, as is well known in the art. The underlying metal layer includes a metal liner 151 made of, for example, Ti, TiN, or TaN; a layer of bulk metal 153, e.g., copper; and a metal cap layer 155, e.g., silicon nitride carbide (SiNC), as are well known in the art. It is noted that the trench extends in a direction perpendicular to the underlying metal layer.

At 160, photoresist is applied to the thick inter-layer dielectric (ILD) block 157. Applying the photoresist entails first applying an optical planarization layer (OPL) 159, followed by an anti-reflection coating (ARC) 161, and finally the actual photoresist 163. The OPL 159 is used to fine-tune planarization of the surface of the dielectric block 157 prior to exposure, in order to reduce distortion of the pattern. The OPL 159 is made of, for example, a spin-on glass (SOG), as is known in the art.

At 162, the photoresist 163 is patterned by exposure to light through a mask fabricated according to the wavy line mask design 110, followed by treatment with a developer that removes portions of the photoresist 163.

Figure 4A:
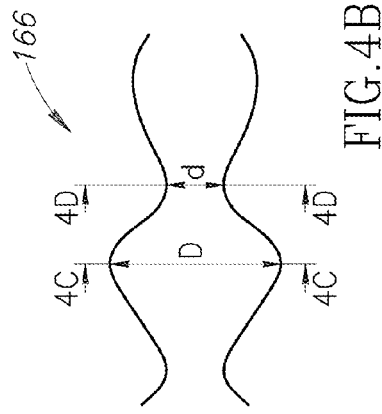
FIG. 4A is a process flow diagram showing a detailed sequence of processing steps that can be used to form wavy trenches using a wavy line mask, according to one embodiment.
Figure 4B:
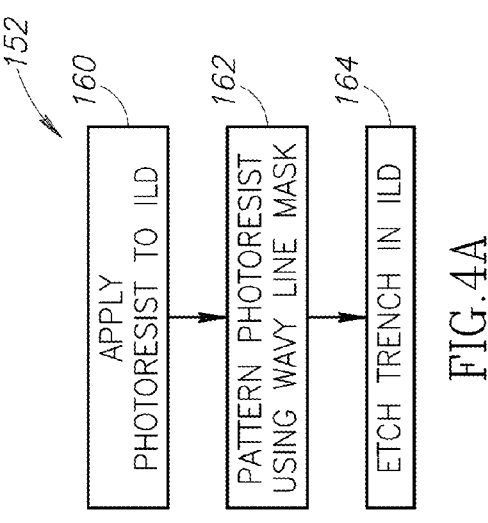
FIG. 4B is a top plan view of wavy trenches after carrying out processing steps shown in FIG. 4A.
Figure 4C:
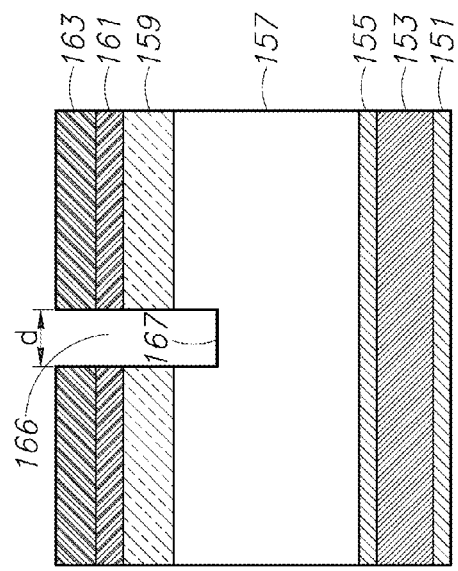
FIGS. 4C and 4D are cross-sectional views, along the cut lines shown, of wavy trenches after carrying out processing steps shown in FIG. 4A.
}
Figure 4D:
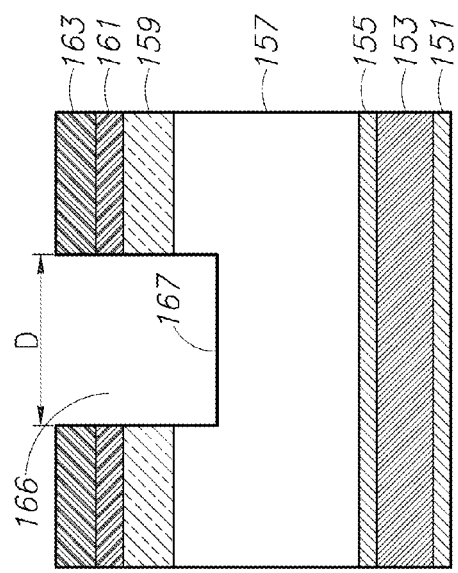

At 164, a wavy line trench 166 is etched in the dielectric block 157 down to a trench depth 167. The wavy line trench 166 includes a wide portion of width D where the via will be formed, as shown in FIG. 4C, and a narrow portion of width d, that corresponds to the nominal metal linewidth, e.g., 24 nm, as shown in FIG. 4D.

FIGS. 5A-5D show and describe the formation of a sacrificial, or disposable, layer, according to one embodiment.

At 170, a sacrificial layer 171 is deposited into the wavy line trench 166. In one embodiment, the sacrificial layer 171 is made of a material such as polysilicon, low-temperature silicon dioxide, or SiN. The sacrificial layer 171 overfills the narrow portion of the trench (d) to a narrow portion thickness 172 having a notch 178 therein, while conformally underfilling the wide portion of the trench (D) to a wide portion thickness 175. Thus, as shown in FIGS. 5C and 5D, the narrow portion d of the trench is entirely blocked, while the wide portion D contains a hard mask that will define a large via having a via width 176.

The via width 176 is much greater than the narrow portion, d, of the metal line, which eases formation of the overall interconnect structure. The significance of the independence of the via width from the nominal metal linewidth d is that a path is cleared for the nominal metal linewidth in future technology generations to shrink without causing via failures. The metal linewidths can continue getting smaller and smaller with each technology generation while the via size remains the same. The narrow portion thickness 172 is larger than d/2, but smaller than D/2. By using the sacrificial layer 171 as a hard mask, a via lithography step is avoided. Via formation without the need for a separate mask layer is referred to by those skilled in the art as a self-aligned via.

In another embodiment, the sacrificial layer 171 is made of a direct self-aligned (DSA) polymer material. A DSA polymer sacrificial layer 171 fills the narrow portions (d) of the wavy line trench so that the narrow portion thickness 172 is negligible. Likewise, the DSA polymer sacrificial layer 171 deposits on the sidewalls of the wide portions (D) to form a hard mask having a negligible wide portion thickness 175. Consequently, use of the DSA polymer as the sacrificial layer 171 simplifies the etch process, as is shown below.

FIGS. 6A-6D show and describe the formation of vias at step 156, according to one embodiment.

At 180, the sacrificial layer 171 is etched to expose a via landing pad 181 at the surface of the underlying bulk metal 153. A first anisotropic etch step removes the sacrificial layer 171 from the bottom of the wavy line trench 166, down to the trench depth 167. If a DSA polymer is used as the sacrificial layer 171, the first anisotropic etch step is not needed because the bottom of the trench is already exposed.

At 182, a second anisotropic etch continues removing dielectric material in a downward direction to the underlying three-metal layer, creating a large via 169. Finally, a third etch step removes the cap layer 155 to expose the bulk metal 153, as shown in FIG. 6C. Meanwhile, as shown in FIG. 6D, the sacrificial layer 171 protects the narrow portion of the wavy line trench 166.

FIGS. 7A-7D show and describe the trench and via fill at step 158, according to one embodiment.

At 190, the sacrificial layer 171 is removed using an etch chemistry that has a high selectivity to the dielectric block 157. For example, if the sacrificial layer 171 is SiN and the dielectric 157 is silicon dioxide, the sacrificial layer 171 can be removed using a phosphoric acid dip.

At 192, the wavy line trench 166 and the large via 169 are filled with metal. The metal fill process includes first depositing a metal liner 195, e.g., titanium (Ti), titanium nitride (TiN), tantalum nitride (TaN), titanium carbide (TiC), cobalt (Co), rubidium (Ru), and combinations thereof; followed by deposition of a bulk metal 197, e.g., aluminum (Al), copper (Cu), tungsten (W), cobalt (Co), nickel silicide (NiSi), cobalt silicide (CoSi), and combinations thereof, wherein combinations include metal laminates, alloys, and the like.

At 194, a chemical mechanical planarization (CMP) step is performed to planarize the metal liner 195 and bulk metal 197 to the height of the dielectric block 157.

The resulting metal lines shown in FIG. 7B are the wavy metal line structures 120 shown in FIG. 2B, including the narrow portions 122 of width d, intermediate portions 123, and wide portions 124 of width D, accommodating the large via 169. If, for example, the metal lines thus formed are at metal 2, the wide portions 124 serve as large via landing pads for subsequently formed vias that will later connect to upper metal lines, e.g., metal 3. It is noted that the large via 169 has an aspect ratio of about 3:1 or less, which can easily be filled with metal compared with existing vias that present more challenging aspect ratios, in the range of about 4:1-5:1.

The techniques presented herein are generic and can be used at any metal layer, to ease constraints on via formation, thus supporting metal structures having a variety of different linewidths. Without the benefit of the structures and processes described herein, via aspect ratios would continue to increase as the nominal metal linewidth shrinks with each new technology generation. Thus, severing the dependence of via dimensions on metal linewidths has important advantages and implications for future generations of integrated circuit development.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An interconnect structure for use in integrated circuits, the structure comprising:
  a first metal line having a plurality of periodically spaced narrow portions, intermediate width portions, and wide portions, each of the portions being spaced apart with respect to one another, and being located at regular intervals along the first metal line, the first metal line extending longitudinally in a first direction;
  a via landing pad formed at each wide portion of the first metal line;

a second metal line vertically spaced apart from the first metal line by an insulating material; and a via forming an electrical connection between the via landing pad and the second metal line.

2. The interconnect structure of claim 1, wherein the first metal line includes one or more of Ti, TiN, TaN, TiC, Co, Ru, Al, Cu, W, Co, NiSi, CoSi, and combinations thereof.

3. The interconnect structure of claim 1, wherein the narrow portions have widths within the range of 5-30 nm.

4. The interconnect structure of claim 1, wherein a ratio of a number of narrow portions to a number wide portions located along the first metal line is at least three.

5. An interconnect structure for use in integrated circuits, the structure comprising:

a first metal line having a first plurality of narrow portions alternating with wide portions, the first metal line extending longitudinally in a first direction;

a second metal line having a second plurality of narrow portions alternating with wide portions, the second metal line extending longitudinally in a direction parallel to the first metal line, the wide portions of the first metal line aligned with the narrow portions of the second metal line;

a via landing pad formed at each wide portion of the first metal line;

a metal layer vertically spaced apart from the first and second metal lines by an insulating material; and vias forming electrical connections between the via landing pads and the metal layer.

6. An interconnect structure for use in integrated circuits, the structure comprising:

a first metal line having a plurality of periodically spaced narrow portions, intermediate width portions, and wide portions spaced apart with respect to one another, the first metal line extending longitudinally in a first direction, the narrow portions defining a nominal metal linewidth;

via landing pads formed at at least some of the wide portions of the first metal line, the via landing pads being wider than the nominal metal linewidth;

a second metal line vertically spaced apart from the first metal line by an insulating material; and vias forming electrical connections between the via landing pads and the second metal line.

7. The interconnect structure of claim 1, wherein the wide portions have widths within the range of 10-40 nm.

8. The interconnect structure of claim 1, wherein the vias have aspect ratios less than 4:1.

9. An apparatus, comprising:

an first array of substantially uniform metal lines formed over a plurality of transistors in a semiconductor substrate;

a dielectric block formed over the first array;

a second array of wavy metal lines formed in the dielectric block, the second array stacked vertically on top of the first array, the wavy metal lines including wide portions spaced periodically between narrow portions the second array of wavy lines having a plurality of lines that are adjacent to each other and adjacent ones of the plurality of wavy metal lines in the second array are staggered relative to one another so that wide portions of a wavy metal line are positioned next to narrow portions of a neighboring wavy metal line; and a plurality of vias formed in the dielectric block, the vias coupling ones of the uniform metal lines to wide portions of respective ones of the wavy metal lines.

10. The apparatus of claim 9 wherein the staggered wavy metal lines of the second array maintain a substantially constant spacing.

11. The apparatus of claim 9, further comprising transistors in the semiconductor substrate, the first and second arrays and the plurality of vias providing electrical connections among the transistors to form integrated circuits thereof.

12. The apparatus of claim 9 wherein a separation between a narrow portion and an adjacent intermediate portion is characterized by an offset distance.

13. The apparatus of claim 9 wherein a distance between adjacent narrow portions is about 48 nm.

14. The apparatus of claim 9 wherein center points of the wide portions and the intermediate portions are arranged along an axis.

* * * * *